(12) United States Patent
Milde

(10) Patent No.: US 12,142,463 B2
(45) Date of Patent: Nov. 12, 2024

(54) DEVICE AND METHOD FOR SUBSTRATE TRANSPORT IN VACUUM PROCESSING SYSTEMS

(71) Applicant: VON ARDENNE Asset GmbH & Co. KG, Dresden (DE)

(72) Inventor: Falk Milde, Dresden (DE)

(73) Assignee: VON ARDENNE Asset GmbH &Co. KG, Dresden (DE)

( * ) Notice: Subject to any disclaimer, the term of this patent is extended or adjusted under 35 U.S.C. 154(b) by 0 days.

(21) Appl. No.: 18/312,606

(22) Filed: May 5, 2023

(65) Prior Publication Data
US 2023/0402266 A1     Dec. 14, 2023

(30) Foreign Application Priority Data

Jun. 8, 2022   (DE) ..................... 10 2022 114 395.3
Sep. 27, 2022   (DE) ..................... 10 2022 124 811.9

(51) Int. Cl.
*H01J 37/32*     (2006.01)
*C23C 14/34*     (2006.01)
*C23C 16/50*     (2006.01)

(52) U.S. Cl.
CPC ........ *H01J 37/32715* (2013.01); *C23C 14/34* (2013.01); *C23C 16/50* (2013.01);
(Continued)

(58) Field of Classification Search
CPC ......... C23C 16/50; C23C 16/54; C23C 16/56; C23C 16/458; H01J 37/32715; H01J 37/32568
See application file for complete search history.

(56) References Cited

U.S. PATENT DOCUMENTS 4,694,779 A * 9/1987 Hammond ............... C23C 16/54
156/345.52
6,287,430 B1 * 9/2001 Matsumoto ........... C23C 14/568
204/192.16
(Continued)

FOREIGN PATENT DOCUMENTS

| DE | 102010060910 A1 | 5/2012 |
| DE | 102012206975 A1 | 1/2013 |
| DE | 102020124022 A1 | 3/2022 |

OTHER PUBLICATIONS

German Search Report for corresponding German patent application 10 2022 124 811.9, dated Jul. 6, 2023, 6 pages (for informational purposes only).

*Primary Examiner* — Joseph A Miller, Jr.
(74) *Attorney, Agent, or Firm* — Viering, Jentschura & Partner mbB

(57) ABSTRACT

Disclosed herein are devices, systems, and methods for transporting a substrate for vacuum processing. The transport may be provided by a substrate carrying device that includes a support area by which a substrate carrier may be moveably supported. The substrate carrying device includes a plurality of electrodes that are galvanically separated from one another. The substrate carrying device includes a plurality of substrate carrying regions arranged consecutively in series with respect to one another, each substrate carrying region including an electrode of the plurality of electrodes and also including a substrate receiving device configured to receive a substrate placed in the substrate carrying region, preferably in physical contact with the electrode.

19 Claims, 4 Drawing Sheets

(52) U.S. Cl.
 CPC .. *H01J 37/32541* (2013.01); *H01J 37/32568* (2013.01); *H01J 2237/032* (2013.01); *H01J 2237/201* (2013.01); *H01J 2237/20221* (2013.01); *H01J 2237/3321* (2013.01)

(56) References Cited

U.S. PATENT DOCUMENTS

| | | |
|---|---|---|
| 2008/0038908 A1 | 2/2008 | Henley |
| 2013/0243966 A1 | 9/2013 | Schett et al. |
| 2016/0217978 A1 | 7/2016 | Mai |
| 2018/0363140 A1* | 12/2018 | Arnet ................ H01J 37/32403 |
| 2019/0252156 A1 | 8/2019 | Mai |

* cited by examiner

DEVICE AND METHOD FOR SUBSTRATE TRANSPORT IN VACUUM PROCESSING SYSTEMS

CROSS-REFERENCE TO RELATED APPLICATION(S)

This application claims priority to German Application No. 10 2022 114 395.3 filed on Jun. 8, 2022 and German Application No. 10 2022 124 811.9 filed on Sep. 27, 2022, each of which are fully incorporated herein by reference in its entirety.

TECHNICAL FIELD

Various embodiments relate to devices, methods, and systems for a substrate transport device, and in particular, for substrate transport in vacuum processing systems.

BACKGROUND

In general, substrates may be processed in a vacuum by means of a plasma (also referred to as plasma-assisted processing), e.g. coated, heated, etched, chemically and/or structurally modified. The plasma may be formed by ionizing a plasma-forming gas. The substrate or a process material may then be exposed to the plasma, e.g., a low-pressure plasma. A commonly used configuration of plasma-assisted processing is known as plasma-enhanced chemical vapor deposition (plasma-enhanced CVD or PECVD). Examples of the use of plasma-assisted processing may be found, among others, in photovoltaics, for the production of smart windows, for the production of smart fabrics, in the semiconductor industry, in screen technology, for special optics and mirrors, but also in the packaging industry.

A low-pressure plasma used in vapor deposition, for example, becomes positively charged by a few 10 volts relative to the surrounding surfaces, so that an electric field is created. The reason for this is the higher mobility of electrons compared to ions. This is associated with the formation of a plasma boundary layer in which ions of the plasma are then accelerated by the electric field, e.g. in the direction of the surfaces. In this context, one speaks of a floating potential.

In many cases, this acceleration is not sufficient to process the substrate. Therefore, a so-called bias voltage is conventionally applied to the substrate in order to increase the electric field and the corresponding potential difference between plasma and substrate. In the case of a metallic substrate, this is possible by means of galvanic contacting of the substrate. In the case of an electrically insulating substrate, on the other hand, the so-called asymmetric high-frequency discharge is used to amplify the electric field, e.g. to generate a high negative bias voltage at the substrate surface.

To amplify the electric field that causes acceleration of ions from a plasma onto an electrically insulated substrate, a high-frequency voltage is conventionally applied to a metallic, isolated, substrate-carrying substrate carrier (also referred to as a carrier) to produce a so-called self-bias voltage (also referred to as a self-bias voltage). Conventionally, this is used to treat and/or coat a substrate in a stationary mode or for a planar carrier that rotates under the plasma source.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various exemplary aspects of the disclosure are described with reference to the following drawings, in which.

DESCRIPTION

Figure 1:
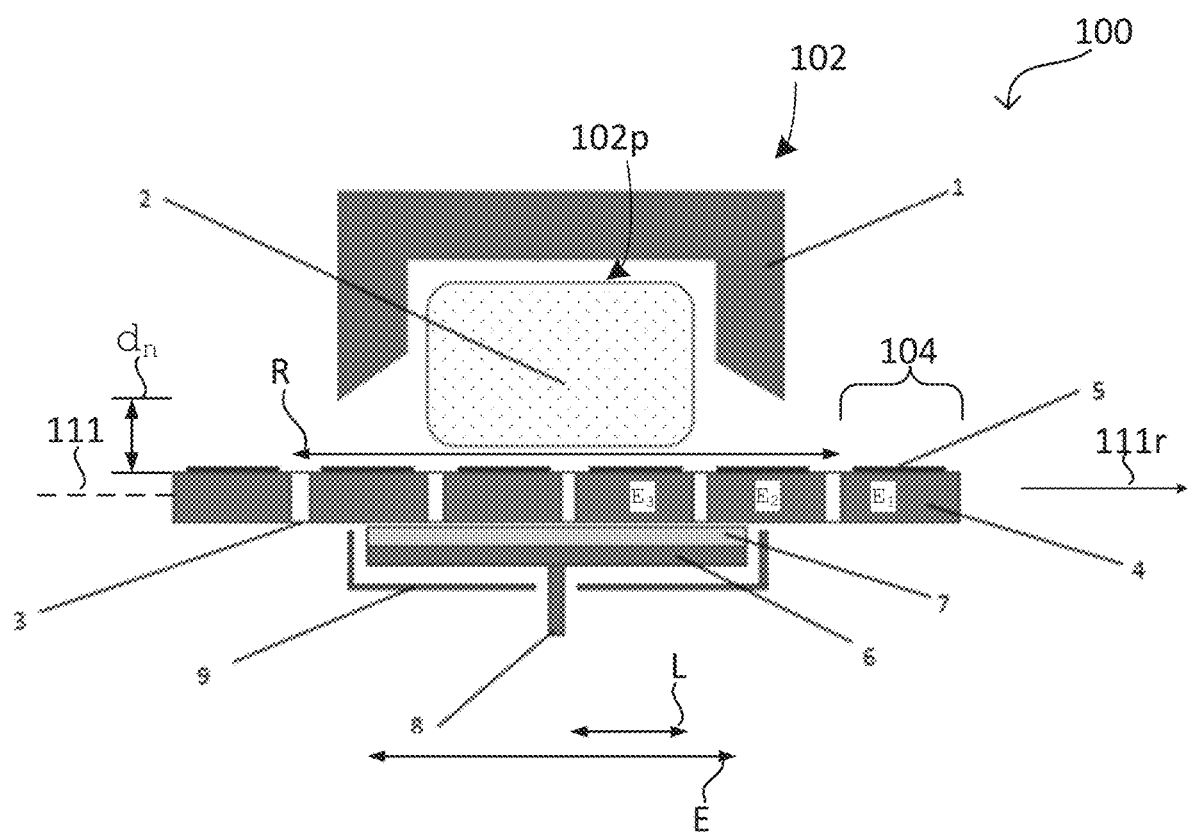
FIG. 1 shows a vacuum process system in a schematic side view or cross-sectional view, looking in the direction of movement.

In the following detailed description, reference is made to the accompanying drawings which form part thereof and in which are shown, by way of illustration, specific embodiments in which the invention may be practiced. In this regard, directional terminology (such as "top", "bottom", "front", "rear", "forward", "rearward", etc.) is used with reference to the orientation of the figure(s) described. Since components of embodiments may be positioned in a number of different orientations, the directional terminology is for illustrative purposes and is not limiting in any way. It is understood that other embodiments may be used and structural or logical changes may be made without departing from the scope of protection of the present invention. It is understood that the features of the various exemplary embodiments described herein may be combined, unless otherwise specifically indicated. Therefore, the following detailed description is not to be construed in a limiting sense, and the scope of protection is defined by the appended claims.

In the context of this description, the terms "connected", "attached," and "coupled" are used to describe both a direct and an indirect connection (e.g. galvanic and/or capacitive connection), a direct or indirect attachment, as well as a direct or indirect coupling. In the figures, identical or similar elements are given identical reference signs where appropriate.

According to various embodiments, the term "coupled" or "coupling" may be understood in the sense of a (e.g., mechanical, hydrostatic, thermal, and/or electrical) connection and/or interaction, e.g., direct or indirect. For example, a plurality of elements may be coupled together along an interaction chain along which the interaction may be exchanged, e.g., an electrical power. For example, two coupled elements may exchange an interaction with each other, e.g., a mechanical, hydrostatic, thermal, and/or electrical interaction. A coupling of a plurality of vacuum components (e.g., valves, pumps, chambers, etc.) to each other may include being fluidly coupled to each other. According to various embodiments, "coupled" may be understood in the sense of a mechanical (e.g., a bodily or physical) coupling, e.g., by means of direct physical contact. A coupling may be configured to transmit a mechanical interaction (e.g., force, torque, etc.).

Electrically conductive may be understood herein as including an electrical conductivity of greater than about 1 Siemens per meter (S/m), e.g., greater than about $10^3$ S/m or greater than about $10^8$ S/m. Electrically insulating may be understood herein as including an electrical conductivity of less than about $10^{-6}$ Siemens per meter (S/m), e.g., less than about $10^{-8}$ S/m, than about $10^{-10}$ S/m, or than about $10^{-14}$. Dielectric (also referred to as dielectric material) may be understood herein as a material (e.g., a solid) in which the charge carriers present are localized (i.e., not freely movable). The dielectric material may be electrically insulating.

According to various embodiments, the area of the carrier (also referred to as the active area) to which the radio frequency voltage (also referred to as the RF voltage) is applied may have an influence on the processing of the substrate, and may therefore be taken as a process parameter. The smaller this area is, the greater this influence may be, and for example, among other things, the energy of the ions impinging on the substrate.

However, for the case of a linear continuous system, the carrier is often much larger, for example, because its length in the direction of movement (also referred to as the direction of flow) is significantly greater than the length of the plasma source in the direction of flow. The same applies to a drum coating system (drum coater), in which the drum circumference may be significantly larger than the length of the plasma source (also referred to as the plasma station) in the direction of circulation. Due to the technically larger geometry, the area ratio may be unfavorable to have an influence on the processing of the substrate. If the carrier is very large—so large, for example, that the active area is similar in size to the area lying at counter-potential, usually the counter-electrode lying at ground potential—this influence on the processing of the substrate may therefore be small.

According to various embodiments, an optimal area ratio of the carrier to the counter-electrode for establishing a medium to high effect may be in the range of about 1:2 to 1:4.

This favors the formation of a sufficiently high self-bias voltage and at the same time inhibits the formation of an undesired spillover plasma (also called parasitic plasma) and its undesired influence on machine components of the vacuum system, as well as inhibits the formation of a high reactive current due to lower inductive and (e.g. mainly) capacitive effects of the high-frequency-loaded machine components. This influence favors the coupling of the desired amount of high-frequency power and increases the efficiency of power utilization.

Disclosed herein is a substrate carrier device, a use thereof, a vacuum processing system, and a method that may provide a more favorable area ratio of the electrodes (e.g., active area of the carrier to counter-electrode), preferably in a range of about 1:2 to about 1:4. This may improve processing of the substrate by providing a self-bias voltage for acceleration of ions from the plasma. This may also inhibit, for example, the formation of an undesired spillover plasma, for example outside the plasma zone of the plasma source, may reduce the reactive current component, may reduce the technical effort for injecting an RF voltage (also referred to as RF coupling), and/or may increase the energetic efficiency of the plasma source.

According to various embodiments, selective coupling of the radio frequency voltage (also referred to as RF voltage or AC voltage in the RF range) occurs in those segments of the substrate carrier device (also referred to as substrate carrier or carrier), for example a carrier drum, which are in interaction with the plasma source, and only to a limited extent beyond those segments.

For this purpose, the carrier illustratively includes a plurality of electrodes galvanically separated from each other (also referred to as carrier segments). This inhibits the high frequency from being coupled onto the entire carrier by galvanic conduction, so that it is primarily coupled to those electrodes which are closest to the plasma and/or the coupling electrode.

Depending on the materials and plasma gases, the speed of movement and the geometric boundary conditions, the coupling may take place, for example, in a non-contact capacitive manner (particularly low-wear), in a sliding capacitive manner (particularly reliable) or in a sliding galvanic manner (e.g. DC conductive). The coupling may take place on protruding surfaces of the carrier from the substrate side and/or also on the rear side of the carrier or also on other machine components of the carrier (e.g. the carrier drum).

Examples of materials that the substrate includes or is made of, according to various embodiments, include: a film, a plate (e.g., made of plastic, glass, silicon, e.g., a wafer), a tape, a mesh, particles, or the like. According to various embodiments, the substrate may be dielectric, for example free of an electrically conductive material.

Herein, forming a plasma may be understood as ionizing the particles (e.g., atoms or molecules) of a gas (also referred to as a plasma-forming gas or working gas). For example, the gas may include an inert gas, such as argon. The ionizing may include extracting electrons from the gas atoms, forming positively charged atomic cores (called ions). The plasma may optionally be supplied with a so-called process gas (e.g., including one or more than one gaseous material) that is excited by the plasma to interact with the substrate. Examples of a process gas include: a precursor, an etchant gas (e.g., a gaseous acid), oxygen, a polymer, a donor gas, and the like.

The substrate may be processed using the plasma, e.g., coated, heated, etched, chemically and/or structurally altered. Coating the substrate may include, for example: Coating a substrate using one or more than one precursor using plasma enhanced chemical vapor deposition (PECVD) (also referred to as plasma assisted chemical vapor deposition (PACVD)). Using the substrate carrier device provided herein, for example, a plasma chemical process may be performed in a low pressure range of about 0.1 to several hundred Pascals (Pa).

To perform plasma-assisted processing of a substrate carried by the substrate carrier, an electrode (also referred to as an RF electrode, main electrode, or driving electrode) connected to an AC power source may be driven in the RF or VHF frequency range. This main electrode may, for example, be part of the plasma source or be a carrier electrode. Preferably, the formation of the plasma is excited or at least supported by means of an excitation frequency in the megahertz range (e.g. 13.56 MHz) which is applied to the carrier electrode. However, a low-frequency excitation frequency in the kHz range is also possible.

Optionally, the plasma source may be supplied (e.g., operated) with electrical power to generate the plasma separately and independently of the carrier electrode (and thus a self-bias voltage excited at the substrate). In such a case, the plasma source and the carrier electrode may differ, for example, in the injected excitation frequency. The excitation frequency, injected by the plasma source, may also be, for example, any frequency from a DC voltage to an AC voltage, for example, in the gigahertz range. For example, the excitation, which takes place by means of the plasma source, may take place by means of a direct voltage, anywhere from a low to high frequency alternating-current voltage, e.g. in the gigahertz range (e.g. generating microwave radiation), and in both continuous form and/or in various pulsed forms.

The substrate may be transported by means of the substrate carrier, for example in the case of smaller substrates like wafers or display glasses, or by means of a roll-to-roll delivery system, for example, for transporting a film as the substrate. The plasma forming region and/or the transport path of the substrate may be located in an evacuable (i.e., pumpable) chamber (also referred to as a vacuum chamber or process chamber). The vacuum chamber may include at least one feedthrough for supplying and/or removing a process gas.

The vacuum chamber may include one or more than one substrate transfer opening for introducing a substrate into the vacuum chamber and/or for removing the substrate from the vacuum chamber. For example, a substrate transfer opening may be slot-shaped. After a plurality of substrates per substrate carrier have been processed, for example, the substrate carrier together with the substrates is discharged by means of a vacuum lock. For this purpose, the continuously moving row of multiple substrate carriers may be separated from one another by first accelerating and then stopping the respective front substrate carrier and successively ejecting it individually. The substrate arranged in the vacuum chamber may be in or may be arranged in the plasma forming area, e.g. transported through it.

Hereinafter, the substrate carrying device may be referred to in connection with a vacuum process system. In this regard, it should be understood that the substrate carrier device may be provided individually or as part of a transport device, and it need not necessarily be part of the vacuum process system. Exemplary implementations of the substrate carrying device are explained for various types of substrate transport. In this regard, it should be understood that the geometry of the substrate carrier device is equally exemplary.

With respect to the process of movement, e.g., of the substrate carrier device, the carrier electrodes, and the substrates transported by means of the moving substrate carrier device, reference is made to the direction of movement. The direction of movement refers to, for example, the direction of a translation (also referred to as the translational direction) or a rotation (also referred to as the rotational direction). For example, the translation may be along a path of motion that is rectilinear and parallel to the direction of translation (the translational direction), where the path may be subdivided into sections. If the motion proceeds along a self-contained motion path that follows the direction of rotation, this may be referred to as orbital motion. In the context of a transport (e.g. of a substrate), the path of motion may also be called a transport path.

An electrode may be understood herein to be electrically conductive, e.g., formed from an electrically conductive material, e.g., formed from a metal.

If a plasma source is used to excite the plasma, the plasma source may include an electrical connection (also referred to as a mating connection), e.g., per electrode of the plasma source, at which the supply voltage is coupled to the electrode of the plasma source. For example, a main electrode of the plasma source may be electrically coupled to a first connection. Alternatively or additionally, the or each counter-electrode (e.g., a supply electrode) of the plasma source associated with the main electrode may be electrically coupled to a second connection. This excitation of the plasma by means of the plasma source may be assisted by means of the substrate carrier described herein.

If the excitation of the plasma takes place by means of the substrate carrier (e.g. if the plasma source is omitted), the supply device may include an electrical connection (also referred to as a counter-connection) at which the supply voltage is coupled to the electrode of the supply device. The counter-electrode associated with the main electrode of the supply device may then be, for example, a grounded chamber wall or another component in the vicinity of the supply device.

Herein it should be understood that provided electrical voltages are related to the same reference potential (e.g. electrical ground) and correspond to an electrical potential whose difference from the reference potential corresponds to the electrical voltage. The so-called self-bias voltage described herein refers to a voltage that is formed on the substrate by an electrical excitation by means of the excitation frequency applied to a so-called coupling electrode. The self-bias voltage is thus capacitively excited by means of an AC voltage (at the excitation frequency).

Further, reference is made herein to an electrode configured as a coupling electrode (also referred to as a supply electrode). This may, for example, provide a counter-electrode to a main electrode of the plasma source, but does not necessarily have to do so. If the plasma source is not used, the coupling electrode may also provide the main electrode for forming the plasma. In this regard, it may be understood that what is described for the counter-electrode may apply by analogy to the main electrode, e.g., where the coupling electrode serves as the main electrode, and vice versa.

FIG. 1 illustrates a vacuum process system according to various embodiments 100 in a schematic side view or cross-sectional view (e.g., looking in the direction of movement 111r), which is configured for translational transport of the substrate carrier device 3 along a (for example, straight-line) path of movement 111 and/or toward a vacuum lock. For this purpose, the substrate carrier device 3 may be transported, for example, with its support area (hidden in the view) resting on transport rollers (not shown).

The vacuum process system 100 includes a plasma source 102. Examples of a plasma source 102 may include: a pre-treatment plasma source, a coating device, an etching device, etc. For example, the coating device may be configured to perform plasma enhanced chemical vapor deposition (PECVD) or physical vapor deposition (PVD). Examples of a coating device include: a PECVD source, a sputtering device, e.g. a magnetron sputtering device.

The plasma source 102 may be configured to form a plasma 2 in a plasma forming region 102p. For this purpose, the plasma source 102 may include one or more than one electrode 1, 6 (also referred to as a plasma source electrode) that may cause formation of the plasma. The exemplary plasma source 102 shown in FIG. 1 has a pair of two plasma source electrodes (also referred to as main electrode and counter-electrode), of which the coupling electrode 6 provides the counter-electrode. A motion path 111 and/or the plasma forming region 102p may be disposed between the plasma source electrodes. The motion path 111 may be, for example, transverse to the direction of gravity.

Optionally, the plasma source may include a plurality of plasma source electrodes that are operated separately from the electrode 6 of the supply device so that the energy for plasma generation may be fed in independently of the electrode 6 of the supply device. Optionally, plasma generation may also be performed without electrodes, for example inductively or by injecting microwave radiation generated by the plasma source.

The vacuum process system 100 includes the substrate carrier device 3, e.g. in the form of a segmented carrier. The substrate carrier device 3 includes the support area (hidden in view) and the plurality of electrodes 4 galvanically separated from each other (e.g., galvanically insulated carrier segments), forming a row of a plurality of electrodes 4 galvanically separated from each other (also referred to as an electrode row). Each of the electrodes 4 (also referred to as a carrier electrode) is electrically conductive and/or metallic. The carrier electrodes 4 are attached so that they are galvanically separated from each other, for example by means of a dielectric and/or by means of a carrier frame (not shown) therebetween.

The substrate carrying region 3 includes a plurality (e.g., 2, 3, 4, 5, 6, 7, or more) of substrate carrying regions 104 arranged in series along a direction of movement 111r of the substrate carrying region 3, each substrate carrying region including (e.g., exactly) one carrier electrode of the plurality of carrier electrodes and a substrate receiving device 5. The substrate receiving device 5 of each substrate carrying region 104 is configured to receive a substrate disposed in the substrate carrying region 104, preferably in physical contact with or at least close to the carrier electrode 4 of the substrate carrying region 104. Being "close" to the carrier electrode 4 may be understood as having a separation between the substrate and the carrier electrode 4 that is smaller than a thickness of the substrate and/or is smaller than 10 mm (e.g., than 1 mm, e.g., than 0.1 mm).

For example, each substrate carrying region 104 may include one or more than one substrate carrier device per carrier electrode 4.

In operation, the substrate carrier device 3 is moved along the movement path 111 so that the carrier electrodes 4 are moved past the coupling electrode 6 along the movement path 111. The supply voltage that forms the self-bias voltage is connected between the coupling electrode 6 and the plasma source (e.g. its main electrode) or between the coupling electrode 6 and a machine component that is at ground potential. The machine component may be, for example, part of the plasma source (e.g., its main electrode 1), a large surface located on the plasma source at ground potential, for example, an inner liner or housing, or the vacuum chamber (e.g., a chamber wall thereof). As a result, the applied supply voltage is capacitively coupled to the carrier electrodes 4. Alternatively, the supply voltage may also be galvanically coupled to the carrier electrode as explained above (e.g. by means of a sliding or roller contact).

The supply voltage is used to generate the self-bias voltage and thus to amplify the plasma of the plasma source, or, if the plasma source is not present or not operated, to supply the plasma completely with electrical power. In other words, in the case where the actual plasma source is not operated or is not present, the high-frequency power used for forming the plasma and also for generating the self-bias voltage may be injected by means of the carrier electrode alone (for processing the substrate).

In an exemplary implementation, the substrate carrying device of each substrate carrying region 104 includes a support surface on which the received substrate may rest, e.g., abut. In such an implementation, the substrate receiving device may optionally include a recess in which the support surface is disposed such that the substrate resting thereon is inserted into the recess. Additionally, the substrate receiving device of each substrate carrying region 104 may include a holding device by means of which the substrate may be held in a form-fitting and/or force-fitting manner, for example a substrate clamping device or a profile rail into which the substrate engages.

In an exemplary implementation, the support area may be part of a carrier frame and/or including two segments extending parallel to each other in the direction of movement 111r, between which the substrate holding devices 5 may be arranged.

The coupling electrode 6 (for example, an RF coupling electrode) may be configured to couple an AC voltage (e.g., RF voltage) to at least some of the plurality of carrier electrodes. For example, the AC voltage (also referred to as the supply voltage) may include a frequency in the high frequency range (e.g., greater than $10^{-2}$ megahertz, e.g., such as $10^{-1}$ megahertz) (also referred to as an RF voltage), preferably of greater than one megahertz (e.g., 13.56 megahertz or greater).

The coupling electrode 6 and/or the plasma source (e.g., its main electrode 1) may include a length along the direction of movement 111r. For example, the length E of the coupling electrode 6 may be smaller than a separation R of two carrier electrodes (e.g., arranged on opposite sides of the carrier 3) of the plurality of carrier electrodes 4 from each other, for example, measured along the movement path 111. For example, the following relation may be satisfied, R=k·E, where, for example, k>1.2, or k>1.4, or k>1.6, or k>1.8, or k>2. Alternatively or additionally, a length L of each of the carrier electrodes 4 along the direction of movement 111r may be smaller than the length E of the coupling electrode 6. For example, the following relation may be satisfied, E=k·L, where, for example, k>1.2 is, or k>1.4 is, or k>1.6 is, or k>1.8 is, or k>2 is, or k>3 is, or k>4 is.

In some embodiments, the main electrode 1 may be a cavity electrode (e.g., in a pretreatment plasma source), plate-shaped (e.g., in a plate-shaped sputtering target of a sputtering device), or tubular (e.g., in a tubular sputtering target of a sputtering device).

Optionally, the plasma source 102 may include a dielectric material 7 that coats the coupling electrode 6. This may minimize the risk of abrasive galvanic contact between the coupling electrode and the substrate carrier 3.

The plasma source 102 may optionally include, e.g. per electrode, an electrical connection 8 at which the supply voltage is coupled to the electrode of the plasma source 102. For example, the main electrode 1 may be electrically coupled to a first connection (not shown). Alternatively or additionally, the coupling electrode 6 may be electrically coupled to a second connection 8, for example when configured ready for operation.

Optionally, the vacuum process system may include, e.g. per coupling electrode 6, a dark space shield 9 surrounding the coupling electrode 6. This inhibits the formation of a parasitic plasma.

Figure 2:
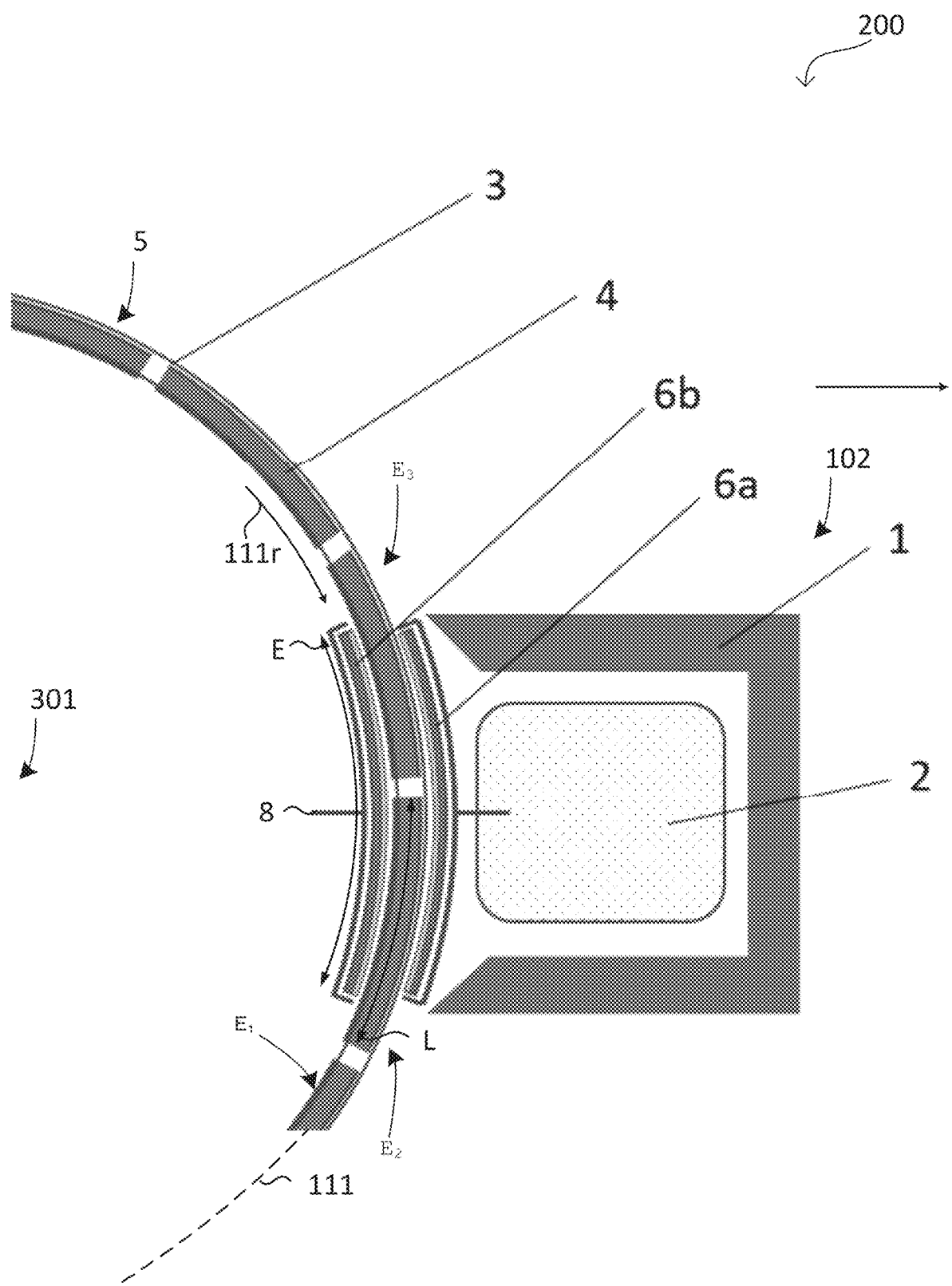
FIG. 2 shows a vacuum process system in a schematic side view or cross-sectional view, looking along the rotation axis of the substrate carrying device.

FIG. 2 illustrates a vacuum process system according to various embodiments 200 in a schematic side view or cross-sectional view (e.g., with viewing direction along the rotation axis 301 of the substrate carrying device 3), which is configured for a rotary transport of one or more than one substrate (also referred to as a continuous flow configuration), for example along a self-contained movement path 111. For this purpose, the substrate carrying device 3 may be rotatably supported within its support area (hidden in the view), for example, by means of a rotary bearing and/or about an axis of rotation 301. The axis of rotation 301 may be aligned along the direction of gravity, for example (e.g., for transporting plate-shaped substrates), or aligned transversely to the direction of gravity (e.g., for transporting belt-shaped substrates). For example, the path of motion 111 may be transverse to the direction of gravity.

In embodiments 200, the substrate carrying device 3 may be designed, for example, as a carrying drum for transporting plate-shaped substrates. In this case, the substrates may be transported in a hanging or standing position.

The exemplary plasma source 102 illustrated in FIG. 2 includes one or more than one coupling electrode 6a, 6b.

For example, one or more than one first coupling electrode 6a (also referred to as external coupling electrode 6a) may be arranged on a side of the substrate carrier device 3 facing the main electrode (e.g., the plasma source 1, if present). Alternatively or additionally, the movement path 111 may pass between one or more than one second coupling electrode 6b (also referred to as an inner coupling electrode 6b) and the main electrode (e.g., the plasma source 1). This creates degrees of freedom in the design, where the length of the electrodes 4 of the plasma source that are needed for a particular radio frequency may be reduced.

Optionally, the vacuum process system may include a dielectric material 7 with which the coupling electrode 6 is coated. This improves the capacitive coupling between the carrier electrode and the coupling electrode 6. This minimizes the risk of abrasive galvanic contact between the coupling electrode and the substrate carrier 3.

The vacuum process system may optionally include, for example per electrode, an electrical connection 8 at which the supply voltage is coupled to the electrode. For example, the main electrode 1 of the plasma source 102, if present, may be electrically coupled to a first connection (not shown). Alternatively or additionally, the or each coupling electrode 6 may be electrically coupled to a second connection 8. For example, the plasma source may be supplied with energy to generate the plasma separately and independently of the coupling electrode 6. In this case, the excitation frequency injected into the coupling electrode 6 may be different from the excitation frequency injected into the plasma source 102 (e.g., its main electrode 1). For example, a DC voltage, a low to high frequency AC voltage, e.g., up to the gigahertz range (e.g., for generating microwave radiation), both continuous and in a wide variety of pulsed forms, may be coupled to the main electrode 1.

Optionally, the vacuum process system may include, e.g. per coupling electrode 6, a dark space shield surrounding the coupling electrode 6. This further inhibits the formation of a parasitic plasma.

Each coupling electrode 6 and/or the main electrode 1 of the plasma source may include a length along the direction of movement 111r. According to various embodiments, the length E of the coupling electrode 6 may be smaller than a circumference U of the substrate carrier device, for example measured along the circulation path 111 of the carrier electrodes 4. For example, the following relation may be satisfied, $U=k \cdot E$, where, for example, $k>2$, or $k>3$, or $k>4$, or $k>6$, or $k>8$, or $k>10$. Alternatively or additionally, a length L of each of the carrier electrodes 4 along the direction of movement 111r, for example measured along the circulating path 111 of the carrier electrodes 4, may be smaller than the length E of the coupling electrode 6. For example, the following relation may be satisfied, $E=k \cdot L$, where, for example, $k>1.2$, or $k>1.4$, or $k>1.6$, or $k>1.8$, or $k>2$, or $k>3$, or $k>4$.

The circulatory path 111 may be self-contained and extend around the axis of rotation 301 of the substrate carrier device 3.

Figure 3:
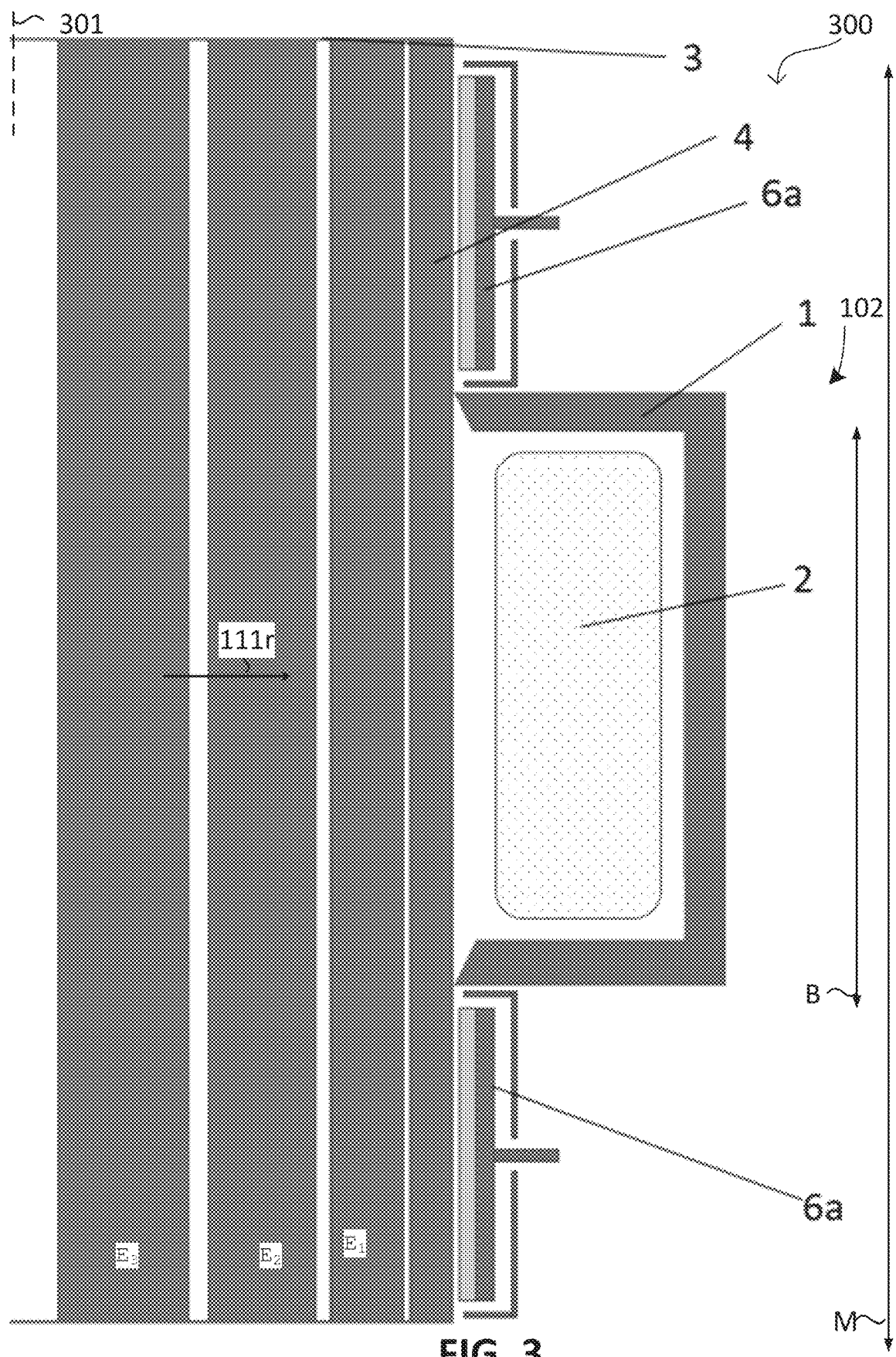
FIG. 3 shows a vacuum process system in a schematic side view or cross-sectional view, looking transverse to the axis of rotation of the substrate carrier device.

FIG. 3 illustrates a vacuum process system according to various embodiments 300 in a schematic side view or cross-sectional view (e.g., looking transverse to the axis of rotation 301 of the substrate carrier device 3). In embodiments 300, the substrate carrier device 3 may be a carrier drum. In this case, the substrates may be transported in a hanging or standing position.

The exemplary plasma source 102 shown here includes two external coupling electrodes 6a, between which the main electrode is arranged. This simplifies the design. For example, a width M of each carrier electrode (measured along the axis of rotation 301 of the substrate carrier device 3) may be greater than a width B of each coupling electrode 6 and/or the main electrode 1. For example, the following relation may be satisfied, $M=k \cdot B$, where, for example, $k>1.4$, or $k>1.6$, or $k>1.8$, or $k>2$, or $k>3$.

Optionally, the plasma source 102 may include a dielectric material 7 that coats the or each coupling electrode 6. This improves the capacitive coupling between the carrier electrode and the coupling electrode 6, minimizing the risk of abrasive galvanic contact between the coupling electrode and the substrate carrier 3.

Optionally, the vacuum process system may include, e.g. per coupling electrode, a dark space shield surrounding the coupling electrode 6. This inhibits the formation of a parasitic plasma.

In an exemplary implementation, the carrier drum 3 of the vacuum process systems 200 and 300 is configured to receive, per substrate receiving device, a plate-shaped substrate. It may be understood that the same may apply, by analogy, to a carrier drum configured to carry a tape-shaped substrate. In this case, the carrying drum does not necessarily have to include the substrate receiving devices, but forms with its circumferential surface the supporting surface on which the substrate rests.

The one or more than one coupling electrodes 6, 6a, 6b described above may be configured to capacitively couple the supply voltage to the carrier electrodes (also referred to as capacitive coupling).

Alternatively to the capacitive coupling, the coupling of the supply voltage to carrier electrodes may also be performed galvanically (also referred to as galvanic configurations), e.g. by means of a supply contact (e.g. sliding contact or roller contact). In that case, a supply contact may be used instead of the coupling electrode 6, 6a, 6b, for example connected to the counter-terminal. It may be understood that optionally any other embodiment described herein may be provided in the galvanic configuration.

Figure 4:
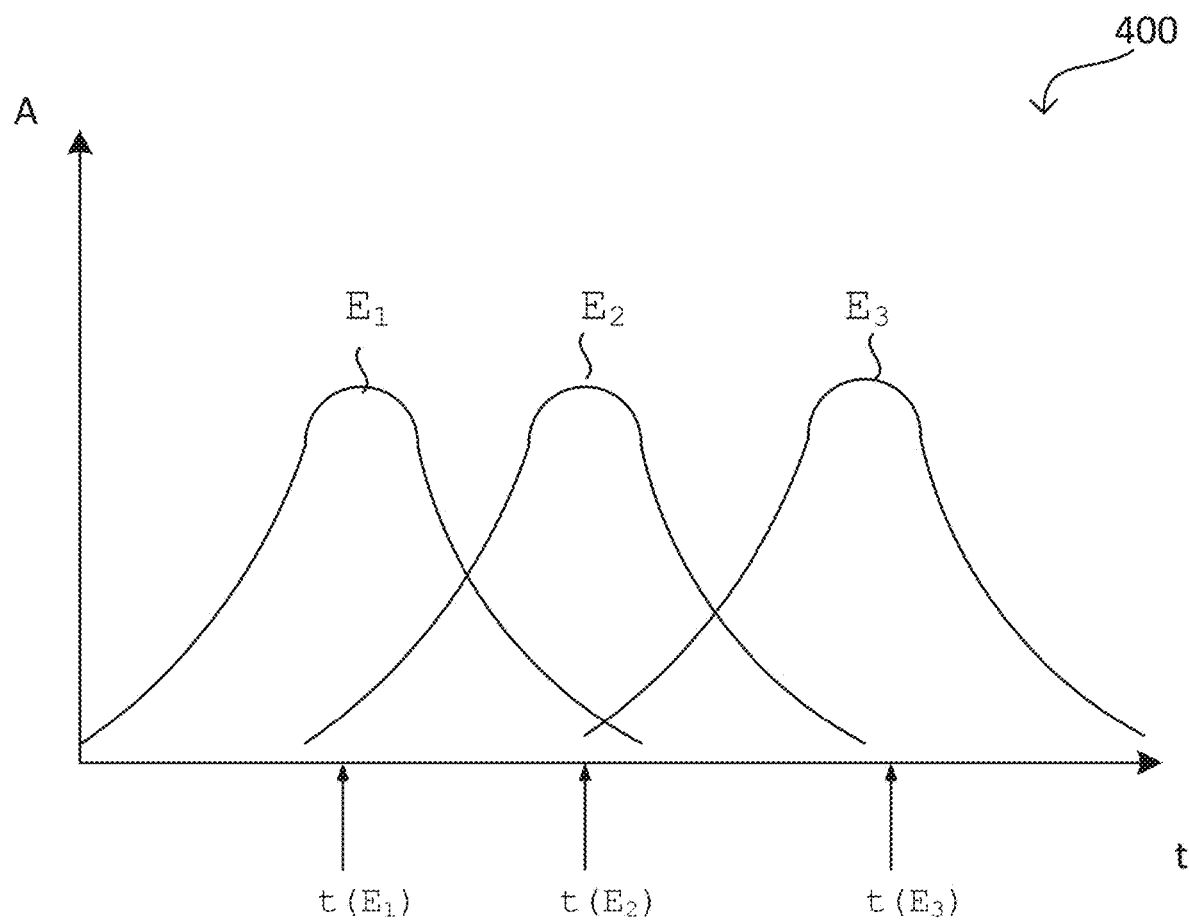
FIG. 4 shows a schematic diagram according to various embodiments.

FIG. 4 illustrates a schematic diagram 400 according to various embodiments, in which the amplitude A of the supply voltage coupled to a carrier electrode $E_n$ is plotted against time t, where n denotes the position of the carrier electrode $E_n$ in the electrode row. The data for an exemplary three (n=1, 2, 3) carrier electrodes $E_1$, $E_2$, $E_3$, which are arranged in series along the direction of movement as an electrode row, are shown in FIG. 4.

When the substrate carrier device 3 is moved, each of the carrier electrodes is moved along the direction of movement, by a segment on the movement path 111. In the course of the movement of the nth carrier electrode $E_n$, the separation $d_n$ of the carrier electrode $E_n$ from the plasma source (also referred to as SG separation $d_n$, see FIG. 1), e.g. its coupling electrode, decreases, reaches a minimum at time $t(E_n)$, and increases again thereafter. The SG separation $d_n$ is thus a function of the time-dependent position of the carrier electrode $E_n$ on the motion path 111.

The amplitude A of the supply voltage coupled to the carrier electrode $E_n$ is in turn a function of the SG separation $d_n$. When the SG separation $d_n$ reaches the minimum, the amplitude A of the supply voltage coupled to the carrier electrode $E_n$, and thus also the electrical power P provided via the carrier electrode $E_n$, reaches a maximum.

Thus, the amplitude A of the supply voltage coupled to the carrier electrode $E_n$ is a function of the position of the carrier electrode $E_n$ on the motion path 111. The power P (also referred to as plasma power) supplied to the plasma by means of the carrier electrode $E_n$ is a function of the amplitude A of the supply voltage coupled to the carrier electrode $E_n$.

Thus, the fraction of plasma power P (e.g., a high-frequency power) injected via the coupling electrode is a function of the time-dependent position of the substrate electrode $E_n$ on the motion path 111, which in turn is a function of the position n in the electrode array and the motion of the substrate carrier device.

This means that the carrier electrodes $E_n$ supply electricity to the plasma in a successive manner. Whereas the plasma power P supplied to the plasma by the nth carrier electrode $E_n$ may decrease, the plasma power P supplied to the plasma by the mth (m>n) carrier electrode $E_m$ may increase. This improves and facilitates the processing of the substrate. This inhibits, for example, the formation of an undesirable spill-over plasma, for example outside the plasma zone of the plasma source, reduces the reactive current component, reduces the technical effort required to couple a supply voltage, and/or increases the energetic efficiency of the plasma source.

What has been described for the separation $d_n$ of the carrier electrode $E_n$ from the coupling electrode (also referred to as SG separation $d_n$) may apply by analogy to the separation of the carrier electrode $E_n$ from the supply contact (e.g. sliding contact) and/or from the plasma.

Optionally, the supply contact and/or each coupling electrode (also referred to as supply electrode) may be attached by means of a spacer configured to induce a compensating movement of the supply contact and/or the coupling electrode upon contact with the substrate carrier device. Such a mechanism favors, for example, a constancy of the separation of the coupling electrode (also referred to as capacitive coupling electrode) from the plurality of electrodes during movement of the substrate carrier device.

The optional dark field shield may be arranged on the back side of the capacitive coupling electrode to avoid spillover plasma at the coupling electrode. Optionally, the coupling electrode 6 may include a dielectric material 7 which mitigates the risk of abrasive galvanic contact between the coupling electrode and the substrate carrier 3.

With respect to the embodiments described herein, it should be noted that the plasma power is at least partially (i.e., partially or fully) coupled to one or more than one carrier electrode (for forming the self-bias voltage on the substrate) by means of the supply device. The plasma power thus coupled onto the carrier electrode may serve solely to generate a plasma, in the case where no plasma source is used for this purpose, or to support a plasma formed by a plasma source.

In the following, various examples are described that relate to what has been described above and what is shown in the figures.

Example 1 is a substrate carrying device, including: a support area by means of which the substrate carrying device may be movably supported in a movement direction (preferably along a path of movement and/or a direction of movement); a plurality of electrodes galvanically separated from each other; a plurality of (e.g. along a direction of movement and/or in a row) consecutively arranged in series (and e.g. rigidly coupled to each other) substrate carrying regions, each substrate carrying region including (e.g. (e.g. exactly) one electrode of the plurality of electrodes, and at least one (i.e. one or more than one) substrate receiving device configured to receive a substrate arranged in the substrate carrying region, preferably in (e.g. physical and/or electrical) contact with or at least close to the electrode, wherein preferably the substrate receiving device of each substrate carrying region is arranged between two (e.g. plate-shaped and/or mutually parallel elongated) segments of the support area.

Example 2 is the substrate carrying device of example 1, wherein the electrode of the or each substrate carrying region is plate-shaped.

Example 3 is the substrate carrier device according to example 1 or 2, wherein the plurality of electrodes are spatially separated from each other, preferably by means of a gap and/or by means of a dielectric.

Example 4 is the substrate carrier device according to any of examples 1 to 3, further including a carrier frame (e.g., frame-shaped) including the support area, and/or holding the plurality of electrodes.

Example 5 is the substrate carrier device according to example 4, wherein the carrier frame is roller-shaped (then also referred to as a carrier drum) or is surface-shaped (e.g., plate-shaped), and/or wherein the carrier frame includes a plurality of spokes.

Example 6 is the substrate carrier device according to any of examples 1 to 5, wherein the plurality of electrodes are attached to the carrier frame, are galvanically separated from the carrier frame, and/or are galvanically separated from the support area.

Example 7 is the substrate carrier device according to any of examples 1 to 6, wherein the direction of movement is a direction of rotation, preferably around an axis of rotation of the support area, or wherein the direction of movement is a direction of translation, preferably along a longitudinal extent of the support area (or at least segments thereof).

Example 8 is a transport device, including: a substrate carrier device according to any of examples 1 to 7; a support device by means of which the substrate carrier device may be movably supported (e.g., in its support area); wherein the support device is preferably configured to provide a translational degree of freedom or a rotational degree of freedom to the substrate carrier device.

Example 9 is a vacuum process system including: a transport device according to example 8 or at least one substrate carrier device according to any of examples 1 to 7; a supply device and/or a plasma source, wherein the plasma source and/or the supply device are configured to provide a plasma, e.g. in a plasma forming region and/or such that the substrate carrier device is exposed to the plasma, preferably when moved relative to the plasma source (e.g., past the plasma source, in the direction of movement, and/or along the path of movement), e.g., when the substrate carrier device passes the plasma forming region; wherein the supply device is configured to couple an AC voltage to the plurality of electrodes with a distribution that depends on a position of the substrate carrier device relative to the supply device.

Example 10 is a vacuum process system, preferably according to example 9, including: a substrate carrier device (e.g. according to any of examples 1 to 7) and a support device (e.g. configured according to the transport device according to example 8), wherein the substrate carrier device by means of the support device is movably (e.g. preferably relative to the plasma source and/or past the plasma source; the plasma source configured to provide a plasma such that the substrate carrier device is exposed to the plasma, preferably when moved relative to the plasma source (e.g. past the plasma source), wherein the substrate carrier device includes a plurality of electrodes arranged consecutively in series (e.g. along the direction of movement) and galvanically separated from each other.

Example 11 is the vacuum process system of example 10, the plasma source further including: a supply device, preferably stationary, configured to couple an AC voltage to the plurality of electrodes, preferably capacitively and/or with a distribution (e.g., across the electrodes) that depends on a position of the substrate carrier device relative to the supply device.

Example 12 is the vacuum process system of example 11, wherein the supply device includes a supply electrode, preferably stationary, configured to capacitively couple the AC voltage, preferably as the plurality of electrodes are moved past the supply electrode; wherein the supply device preferably includes a spacer configured to excite compensating movement of the supply electrode upon contact with the substrate carrier device.

Example 13 is the vacuum process system of example 11 or 12, further including: a voltage source configured to provide the AC voltage, preferably at a frequency in the radio frequency (also referred to as RF) range and/or of greater than one megahertz.

Example 14 is a method including: transporting a (e.g. dielectric) substrate along a (rectilinear or curved, e.g. self-contained) transport path, wherein the substrate is supported during transport by means of a substrate carrier device (e.g. according to one of examples 1 to 13) including a plurality of electrodes arranged in series along the transport path and galvanically separated from each other; supplying a plasma, by means of which the substrate is processed, with electric power by means of coupling an AC voltage to the plurality of electrodes, wherein preferably a distribution of the electric power to the plurality of electrodes depends on a position of the electrodes relative to the plasma. For example, the plasma supplied by coupling an AC voltage to the plurality of electrodes may be formed by means of a plasma source (for example, the plasma may then be maintained without coupling an AC voltage to the plurality of electrodes). Alternatively, the plasma may be supplied only by means of electrical power supplied by coupling AC voltage to the plurality of electrodes.

Example 15 is using a substrate carrier device including a plurality of electrodes arranged in series along a path and galvanically separated from each other for supplying electrical power to a plasma to which a (e.g. dielectric) substrate carried by the substrate carrier device and transported along the path is exposed, by means of coupling an AC voltage to the plurality of electrodes, wherein preferably a distribution of the electrical power to the plurality of electrodes depends on a position of the electrodes relative to the plasma.

Example 16 is configured according to any of examples 1 to 15, wherein each electrode of the plurality of electrodes is electrically conductive and/or metallic.

Example 17 is configured according to any of examples 1 to 16, wherein the AC voltage includes a frequency in the high frequency range, preferably of more than one megahertz.

Example 18 is configured according to any one of examples 1 to 17, wherein the or each substrate is plate-shaped; or wherein the substrate is tape-shaped.

Example 19 is configured according to any of examples 1 to 18, wherein the plurality of electrodes of the substrate carrier device include at least 4 (or 6 or 10) electrodes and/or are rigidly coupled together.

Example 20 is configured according to any one of examples 1 to 19, wherein the at least one substrate carrying region of each substrate carrying region includes at least 2 (or 4 or 6) substrate carrying regions and/or is rigidly coupled to the electrode of the substrate carrying region.

Example 21 is configured according to any of examples 1 to 20, wherein the plurality of electrodes are arranged consecutively in series (e.g., in a row) along a path (e.g., self-contained or rectilinear) along which the plurality of electrodes are preferably moved when the substrate carrier device is moved.

Example 22 is configured according to any of examples 1 to 21, wherein the plurality of electrodes of the substrate carrier device are configured in the same manner.

Example 23 is configured according to any of examples 1 to 22, wherein the electrode of the substrate carrying region overlaps (e.g., completely overlaps) the substrate receiving device.

Example 24 is configured according to any one of examples 1 to 23, wherein the electrode of the substrate carrying region along the direction of movement (or at least the path) has a greater extent than the substrate received in the substrate receiving device of the substrate carrying region.

Example 25 is configured according to any of examples 1 to 24, wherein the electrode of the substrate carrying region along the direction of movement (or at least the path) has an extent greater than that of the substrate receiving device of the substrate carrying region.

Example 26 is configured according to any one of examples 1 to 25, wherein the support area is configured such that the substrate carrier device may be translationally or rotationally moveably supported by the support area.

Example 27 is configured according to any of examples 1 to 26, wherein the substrate carrier device may be movably supported by the support area along a translational direction of movement (also referred to as the direction of translation) or a rotational direction of movement (also referred to as the direction of rotation).

Example 28 is configured according to any one of examples 1 to 27, wherein the support area includes two (e.g., longitudinally extending parallel to each other) segments (e.g., between which one or more than one, e.g., each, substrate carrying region of the plurality of substrate carrying regions is disposed, e.g., partially or completely), or wherein the support area is disposed between the electrodes of two substrate carrying regions of the plurality of substrate carrying regions.

Example 29 is configured according to any of examples 1 to 28, wherein a path along which the substrate carrying regions are arranged consecutively in series surrounds the support region in a closed manner or is extended in a straight line (for example along a longitudinal extension of the two segments and/or along the direction of movement), preferably between the two segments of the support region.

Example 30 is configured according to any of examples 1 to 29, wherein the vacuum process system further includes a vacuum chamber in which the plasma source and/or the motion path are disposed.

Example 31 is configured according to any of examples 1 to 30, wherein the supply device is configured to galvanically or capacitively couple the AC voltage to the plurality of electrodes.

Example 32 is configured according to any of examples 1 to 31, wherein the supply device is configured to supply electrical power to a plasma to which the substrate carrier device is exposed when moved past the supply device by coupling an AC voltage to the plurality of electrodes with a distribution that depends on a position of the substrate carrier device relative to the supply device.

The invention claimed is:

1. A substrate carrier comprising:
   a support area;
   a plurality of electrodes that are coupled to the support area and galvanically separated from one another;
   a plurality of substrate carrying regions arranged consecutively in series with respect to one another, each substrate carrying region comprising:
     an electrode of the plurality of electrodes; and
     a substrate receiving device configured to receive a substrate placed in the substrate carrying region.

2. The substrate carrier of claim 1, wherein the substrate receiving device is configured to place the electrode in physical contact with the substrate.

3. The substrate carrier of claim 1, wherein the substrate receiving device is configured to place the electrode in physical and electrical contact with the substrate.

4. The substrate carrier of claim 1, wherein each of the plurality of electrodes is plate-shaped.

5. The substrate carrier of claim 1, further comprising a carrier frame that comprises the support area and/or that holds the plurality of electrodes.

6. The substrate carrier of claim 5, wherein the carrier frame is roller-shaped and comprises a plurality of spokes.

7. The substrate carrier of claim 5, wherein the plurality of electrodes are attached to the carrier frame.

8. The substrate carrier of claim 7, wherein the plurality of electrodes are galvanically separated from the carrier frame.

9. The substrate carrier of claim 1, wherein the plurality of electrodes are spatially separated from each other by a separation region.

10. The substrate carrier of claim 9, wherein the separation region comprises a gap or a dielectric.

11. The substrate carrier of claim 1, wherein the support area comprises two carrier segments, wherein each segment of the two carrier segments extends longitudinally parallel to a transport direction of the substrate carrier.

12. The substrate carrier of claim 11, wherein each substrate carrying region of the plurality of substrate carrying regions is at least partially arranged between the two segments.

13. The substrate carrier of claim 11, wherein the support area is located between two substrate carrying regions of the plurality of substrate carrying regions.

14. The substrate carrier of claim 1, wherein the substrate carrying regions are arranged consecutively in series along a path, wherein the path encloses the support area.

15. The substrate carrier of claim 1, wherein the substrate carrying regions are arranged consecutively in series along a path that is straight.

16. A vacuum processing system comprising:
   a supply device;
   a support device; and
   a substrate carrying device movably supported relative to the supply device via the support device, wherein the substrate carrying device comprises a plurality of electrodes arranged consecutively in series and galvanically separated from one another, wherein the supply device is configured to supply a plasma to which the substrate carrying device is exposed when moved relative to the supply device, wherein the supply device is configured to supply the plasma with electrical power by coupling an alternating current (AC) voltage to the plurality of electrodes with a distribution of the AC voltage that depends on a position of the substrate carrying device relative to the supply device.

17. The vacuum processing system of claim 16, wherein a plasma source comprises the supply device, wherein the plasma source is configured to expose the substrate carrying device to the plasma as the substrate carrying device is moved relative to the plasma source.

18. The vacuum processing system of claim 16, wherein the supply device comprises an electrode.

19. The vacuum processing system of claim 16, wherein the supply device is configured to galvanically or capacitively couple the AC voltage to the plurality of electrodes.

* * * * *